United States Patent [19]
Sconce

[11] Patent Number: 5,291,154
[45] Date of Patent: Mar. 1, 1994

[54] SYNCHRONOUS SINGLE CYCLE SAMPLE AND CONTROL AMPLITUDE MODULATOR

[76] Inventor: Freddie O. Sconce, 5317 S. 300th Pl., Auburn, Wash. 98001

[21] Appl. No.: 927,206

[22] Filed: Aug. 7, 1992

Related U.S. Application Data

[63] Continuation-in-part of Ser. No. 858,824, Mar. 27, 1992, abandoned.

[51] Int. Cl.$^5$ .................................................. H03C 1/36
[52] U.S. Cl. ................................ 332/149; 332/177; 332/178
[58] Field of Search ............... 332/115, 116, 149, 151, 332/152, 176, 177, 178

[56] References Cited

U.S. PATENT DOCUMENTS

| | | |
|---|---|---|
| 3,432,759 | 3/1969 | Stone . |
| 3,528,037 | 9/1970 | Yamazaki . |
| 3,906,401 | 9/1975 | Seidel ..................... 332/151 |
| 4,072,958 | 2/1978 | Hayami et al. ............ 358/296 X |
| 4,205,241 | 5/1980 | Fisher et al. ............. 307/361 |
| 4,520,328 | 5/1985 | Murakami et al. ......... 331/116 R X |
| 4,614,911 | 9/1986 | Kawano .................. 329/362 |
| 4,737,723 | 4/1988 | Mita ..................... 328/120 |

FOREIGN PATENT DOCUMENTS 52-7660  1/1977  Japan .

OTHER PUBLICATIONS

Anderson, International Published Application No. WO91/03899, published Mar. 21, 1991.

*Primary Examiner*—Siegfried H. Grimm
*Attorney, Agent, or Firm*—Henderson & Sturm

[57] ABSTRACT

Disclosed herein is a synchronous single cycle sample and control amplitude modulator for use with any carrier frequency. The modulator includes both a data input and a sine wave generator coupled with a sample and hold device. The sample and hold device synchronizes the data and the sine wave signal and then transmits the synchronized signal to a modulator. The modulator modulates the synchronized data and the sine wave signal such that a sampled and controlled, synchronous single cycle amplitude modulated signal is produced.

14 Claims, 7 Drawing Sheets

SYNCHRONOUS SINGLE CYCLE SAMPLE AND CONTROL AMPLITUDE MODULATOR

AUTHORIZATION PURSUANT TO 37 CFR 1.71 (d) (e)

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CROSS REFERENCE TO RELATED APPLICATIONS

Claiming Benefit Under 35 U.S.C. 120

This application is a continuation-in-part of U.S. application Ser. No. 07/858,824 filed Mar. 27, 1992, by F. Sconce and now abandoned.

INCORPORATION BY REFERENCE

The foregoing co-pending and earlier application is hereby incorporated herein by reference in its entirety, including drawings and appendices.

TECHNICAL FIELD

The present invention is directed to amplitude modulators and more particularly to a synchronous single cycle sample and control amplitude modulator.

Description of the Prior Art

Carrier frequencies are utilized to transmit audio, data, and the like (transport frequencies). In such applications it would be advantageous if a signal to be carried could be shifted up to a carrier frequency, transmitted at the carrier frequency, and shifted back down to audio, data, or the like, at a receiving point. However, this is not possible since an attempt to transmit a combination wave results in only the radiation of the carrier frequency.

Prior art devices are available, however, which make it possible for one frequency to control the amplitude of another frequency. The process utilized to obtain this result is known as amplitude modulation. In amplitude modulation a radio frequency is modulated at an audio frequency and receiving equipment may be utilized, in a process known as detection, to disclose the audio signal.

Conversely, in a process known as heterodyning a radio frequency is utilized to modulate another radio frequency. Beat frequencies is the general term for both the sum and difference frequencies generated during amplitude modulation and heterodyning. Beat frequencies are more specifically referred to as the upper side frequency for the sum and the lower side frequency for the difference.

In a similar process, carrier shift modulation is utilized to carry data via telephone lines and the like. Data is commonly carried, in carrier shift modulation, with a 14 kHz tone. The prior art does not disclose an apparatus capable of providing a carrier frequency that is synchronized to the data transport frequency.

Several related but disparate prior art devices have been disclosed. For example, Stone, U.S. Pat. No. 3,432,759, discloses a noise eliminating and balanced modulator/mixer; Yamazaki, U.S. Pat. No. 3,528,037, discloses a circuit for correcting distortion in an amplitude modulation system; Seidel, U.S. Pat. No. 3,906,401, discloses an error corrector for certain modulators; Fisher, et al., U.S. Pat. No. 4,205,241, discloses a quantized modulation systems; and finally, Murakami, et al., U.S. Pat. No. 4,520,328, discloses an amplitude modulation circuit with stable modulation characteristics. Prior art also discloses the ability to place digital information onto a analog signal but does so only after converting the digital information into an analog signal and then combining it with a analog carrier frequency. Thus, the prior art does not disclose an apparatus capable of providing synchronous single cycle sample and control amplitude modulation.

OBJECTS OF THE INVENTION

Therefore, it is a principal object of the present invention to provide an improved amplitude modulator.

Another object of the present invention is to provide a synchronous single cycle sample and control amplitude modulator capable of synchronizing the DATA input into the modulator with the carrier frequency.

Another object of the present invention is to provide a synchronous single cycle sample and control amplitude modulator wherein the modulation level is changed only while the modulator is near or below the drain current cut off.

Another object of the present invention is to provide a synchronous single cycle sample and control amplitude modulator which does not require tones.

Another object of the present invention is to provide a synchronous single cycle sample and control amplitude modulator which does not require a frequency shift.

Another object of the present invention is to provide a synchronous single cycle sample and control amplitude modulator wherein only the carrier amplitude is utilized, and detection during receiving is level.

Another object of the present invention is to provide a synchronous single cycle sample and control amplitude modulator that is capable of transferring digital information on an analog carrier frequency without needing to first convert the digital information into an analog signal.

Finally, another object of the present invention is to provide a synchronous single cycle sample and control amplitude modulator wherein the only sidebands produced during modulation correspond to the DATA rate.

Other objects, advantages, and novel features of the present invention will be appreciated by the following detailed description of the invention when considered in conjunction with the accompanying drawings.

SUMMARY OF THE INVENTION

A synchronous single cycle sample and Control amplitude modulator is disclosed which may be utilized with any carrier frequency from audio to 40 megacycles. The present invention includes both data and carrier inputs coupled with a sample and control device.

The sample and control device synchronizes the data and carrier frequencies and then transmits the synchronized signal to a modulator. The modulator modulates the synchronized data and carrier frequencies such that a sampled and controlled, synchronous single cycle amplitude modulated signal is produced.

BRIEF DESCRIPTION OF THE DRAWINGS

The objects and advantages of the invention will become apparent upon reading the following detailed description and upon reference to the drawings, in which.

While the invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

DESCRIPTION OF THE PREFERRED EMBODIMENT

Figure 1:
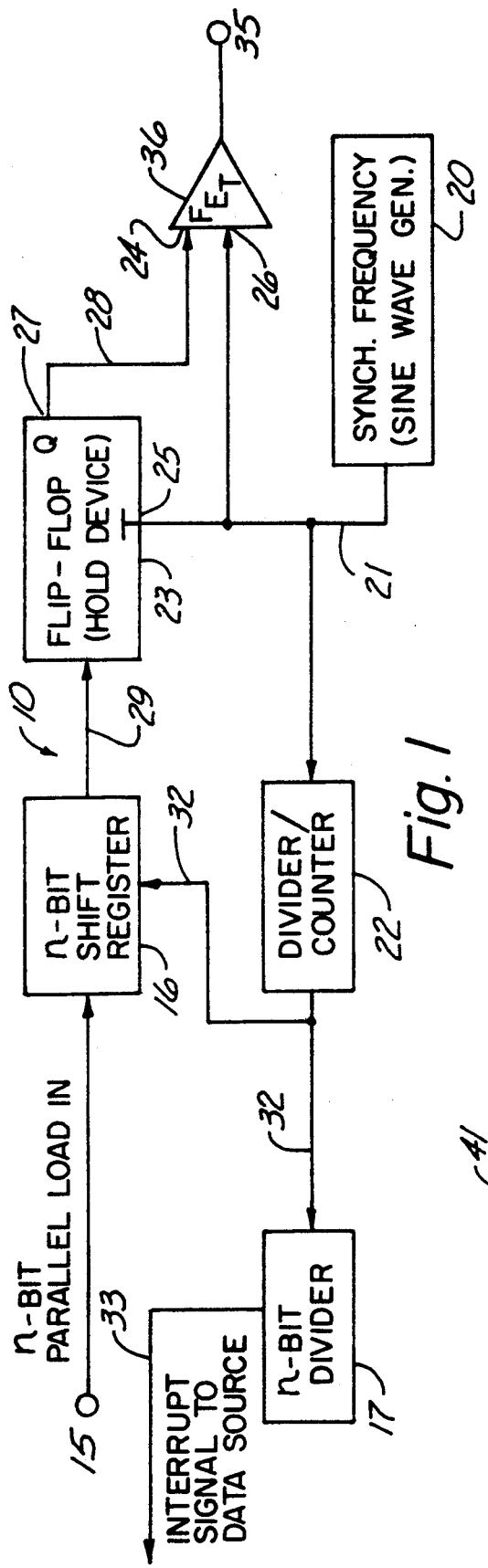
FIG. 1 is a block diagram of a first embodiment of a synchronous single cycle sample and control modulator built in accordance with the present invention.

Referring generally now to the drawings wherein like reference numerals designate identical or corresponding parts throughout the several views, FIG. 1 is a block diagram of a modulator 10 built in accordance with the present invention. A parallel load such as a data bus is loaded into the circuit at input 15. The input is connected to a shift register 16 which is configured or designed to be the same bit length as the loaded parallel data. The shift register 16 is triggered by a divider/counter 22 which also triggers a divider 17 used to signal that another parallel load should by sent to the shift register 16. The divider 17 is chosen or configured to match the size of the bits being loaded at input 15. For example, if the bit length is sixteen, then the divider/counter 22 will trigger the shift register sixteen times such that the entire parallel load is shifted out of the register 16. The divider 17 will also be triggered by the divider/counter 22 and on the sixteenth trigger will signal to the data source (not shown) that another parallel load of sixteen bits are required. Divider/counters and shift registers are well known in the industry and a wide variety exist which would be suitable in this circuit.

A sine wave generator 20 is used to generate a specified synchronizing frequency wave. The output of the generator 20 is connected by line 21 to a Flip-Flop (hold device) 23 at the trigger 25, a dual gate FET 30 at input 26, and a divider/counter 22. The divider/counter 22 divides the generated frequency by the desired number of cycles per bit of data transferred. For example, if one bit of data is to be transferred every five cycles, then the counter would be a divide by five counter. The output of the divider/counter is used to trigger the shift register 16 and is connected through line 32. The output is also connected to trigger the n-bit divider 17. As seen above, by using the same trigger for the shift register 16 and n-bit divider 17 data will be automatically loaded into the shift register 16 at the appropriate time.

Figure 3:
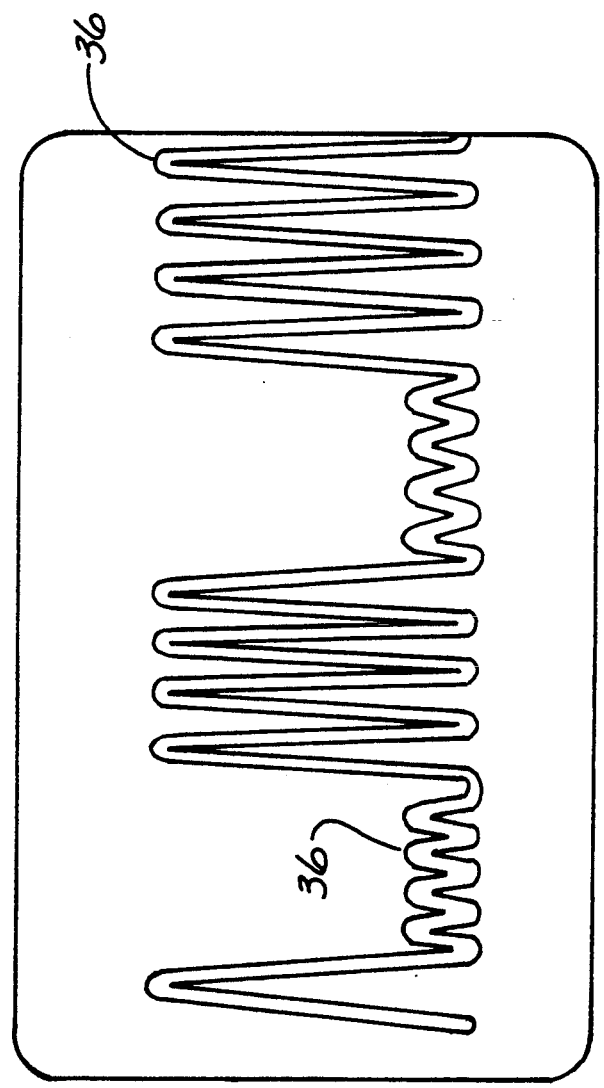
FIG. 3 is a diagrammatic illustration of an oscilloscope cycle by cycle image of an ideal wave form produced by an embodiment of the present invention.

The output of the sine wave generator 20 is connected to the trigger 25 of the Flip-Flop 23 and to one input 26 of the dual gate FET 30 using line 21. The other input 24 of the dual gate FET 30 is connected to the output 27 of the Flip-flop 23 by line 28. Using the sine wave generator 20 as the trigger for the Flip-flop 23 synchronizes the data output 27 and the output of the sine wave generator 20 as they enter the FET 30. Thus, the output 35 of the FET 30 is a wave with the frequency controlled by the sine wave generator 20 and has the amplitude controlled by the data output 28. The number of cycles each individual bit of information controls the sine wave is determined by the divider/counter 22. FIG. 3 shows a sample wave pattern which could be generated by the present invention. Each bit of data is held on the sine wave for four cycles in this particular example. The output 35 of the modulator 10 can be used to transmit data directly over a ny direct wired medium such as coaxial cable or telephone lines.

Figure 2:
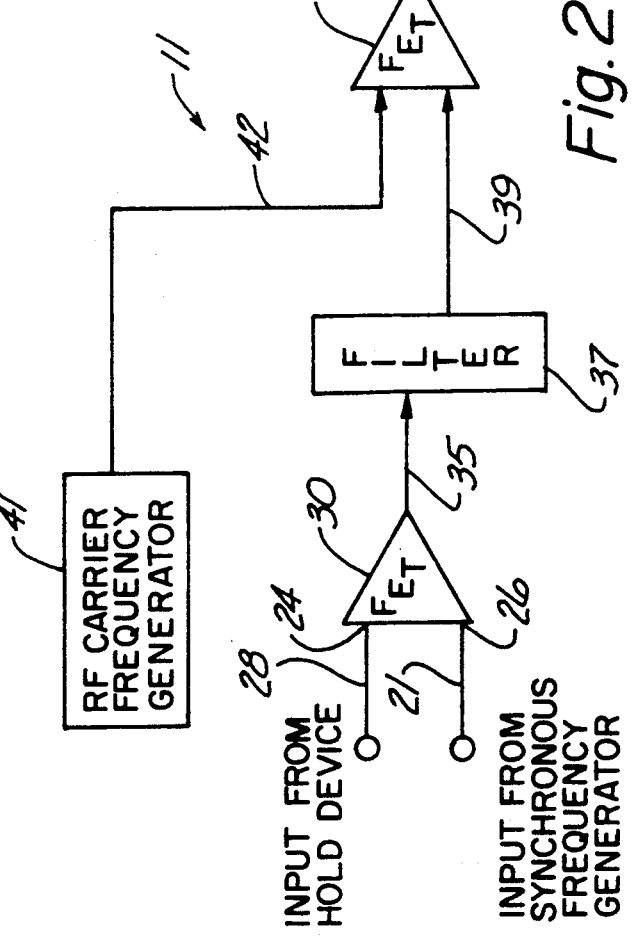
FIG. 2 is a block diagram showing electrical components which allow the combination of an RF signal and the output of the modulator of FIG. 1.

FIG. 2 shows additional components 11 which could be incorporated into the modulator 10 of FIG. 1. The output 35 of the FET 30 is sent through a band pass filter 37. The band pass filter is selected to correspond to the frequency used in the sine wave generator 20. The band pass filter 37 will effectively remove any sidebands created by the modulator 10. The filtered signal can then be combined with an RF frequency signal 42 using a second FET 40. The RF signal 42 is generated by RF frequency generator 41. The output 45 of the FET 40 can be utilized on any medium which uses RF frequencies. For example, the output 45 could be wired to an amplifier and antenna (not shown) such that the data could be transferred over the airwaves.

Figure 4:
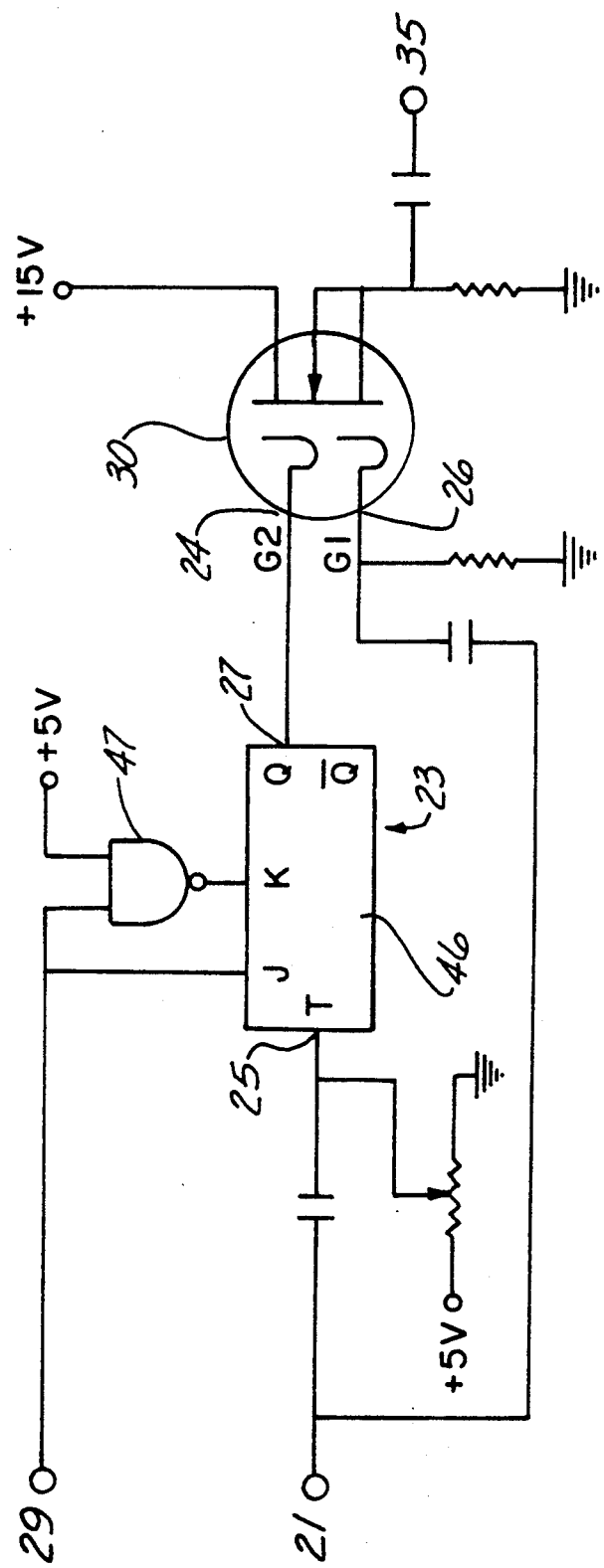
FIG. 4 is a schematic diagram of one possible sample and hold device and amplifier which could be used in the present embodiment.

Referring now to FIG. 4, one possible implementation of the Flip-flop (hold device) 23 and FET 30 is shown. The Flip-flop 23 utilized is a negative edge triggered JK Flip-Flop 46. A field effect transistor (FET) 30 (a ECG454 dual gate MOSFET ["N" channel] with UHF/VHF amplifier operating up to 900 Mhz) is electrically coupled at gate #2 24 to the JK Flip-Flop 46 Q output 27. Obviously, a wide variety of sample and hold devices are known in the art and could be used in the present invention in place of the Flip-flop 23.

Data from the shift register enters the circuit at input 29 connected to the J input of the Flip-Flop 46. The data entering the input 29 is inverted using a NAND gate 47 and the output of the NAND gate 47 is connected to the K input of the Flip-Flop 46. The synchronizing sine wave enters at pin 21. Together, the Flip-Flop 46 and NAND gate 47 act as a sample and hold device and synchronize the data and carrier before they enter the FET 30. The FET 30 drain outputs a synchronous single cycle amplitude modulated signal.

The dual gate FET 30 operates like two separate single gate FETS in series so that when either gate is driven low enough to cut off current flow through its section, there can be no current flow from source to drain.

When either gate #1 26 or #2 24 is held at +4 volts DC and the remaining gate is reduced to −2 volts, there is no current flow from source to drain, except leakage in the very low micro ampere range. Since the DRAIN to SOURCE is actually a solid material, there will always be minor current leakage. However, this leakage provides constant feed through of low level RF. Naturally, when one gate is held at +2 volts, for example, a reduction in current can be expected, resulting in a reduction in gain in the circuit.

This type MOSFET 30 is frequently used as an RF mixer circuit, to obtain heterodyne action. It is also commonly utilized as an automatic gain control and RF amplifier circuit in radio receivers.

In an AGC circuit, usually only a few millivolts change on one gate is enough to maintain a sufficient output from the receiver. Naturally, there is a short delay in such an AGC circuit which permits the output to pass from high to low volume audio in amplitude modulated signals but in FM modulated use, less if any delay is required. The present circuit is very similar to an AGC circuit in that it is a GATED gain control of the amplifier operation.

The dual negative edge triggered Flip-Flop 46 is normally RESET when the circuit is activated. This means that the −Q (not Q) level output will be at a positive voltage level of approximately 2 volts less than the VCC voltage applied to the component. At the same time, the Q output will be approximately +0.4 volts. If this condition is held, the Q output will only furnish about 0.25 volts to gate #2 24 of the FET 30, and the gain will be very low. After turn on, if the J input is held LOW, the before stated condition will be maintained regardless of any incoming triggers. In fact, the condition of the output will not change until the J input receives a positive DATA signal.

In normal use, the K input of the Flip-Flop 46 is reverse polarity to the J input. Likewise, when DATA comes in HIGH on the J input, LOW will also be applied at the same time to the K input. When the next trigger arrives at the trigger input, the Flip-Flop 46 changes to its only other state, that is, the Q output will go to the same voltage previously produced at the −Q output (or approximately +4.0 volts. Additionally, the output of −Q will then be reduced to the level previously held at Q. Each time the voltage levels change on the J and K inputs, the next trigger will change which output, either Q or −Q is high and low. This operation of the MOSFET 30 and Flip-Flop 46 means that each time the J input of the Flip-Flop 46 is HIGH, greater amplification of the carrier takes place, and each time J goes LOW, the gain will be reduced.

The carrier trigger signal should be approximately 3 to 5 volts RMS. When that is converted to a peak to peak signal, a maximum positive signal of approximately +4.9 volts and a negative of −4.9 volts is obtained. This negative level is ample to cut off current through the FET 30 on each negative cycle. At the same time, the positive signal will reach an adequate level for some output when the #2 24 gate signal is LOW. Likewise, when gate #2 24 is at HIGH the signal level is HIGH and the output will be much greater. Of course, the carrier is applied to gate #1 26 and the Q output of the Flip-Flop is on gate #2 24. In this circuit, Q is not tied to any other circuit.

Figure 5:
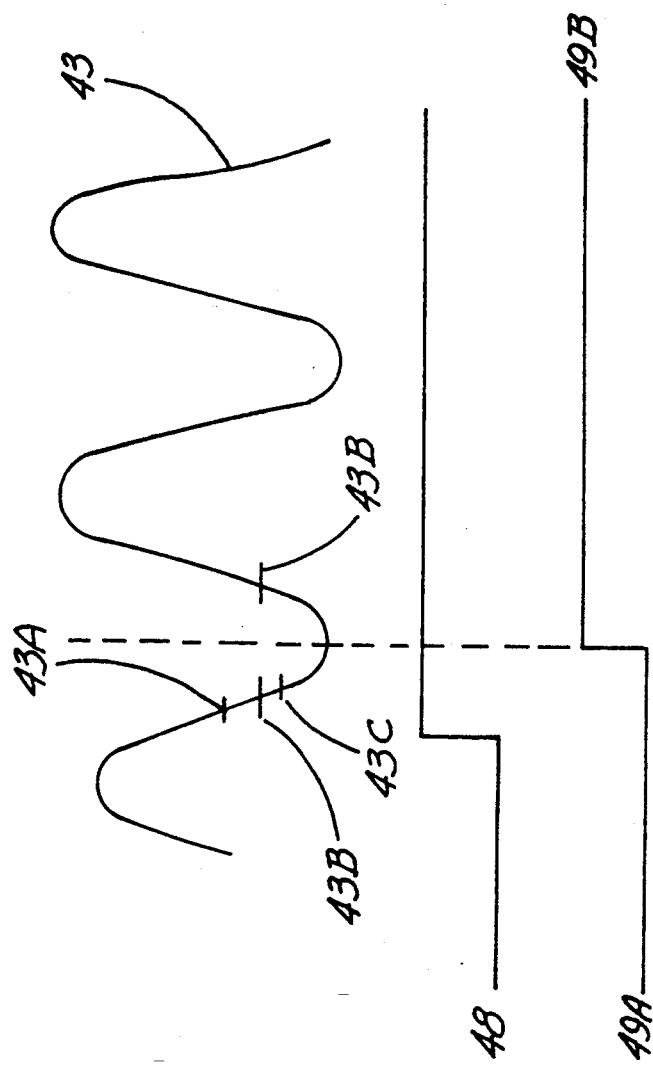
FIG. 5 is a graphical representation of a sample output of an exemplary first embodiment of the present invention wherein the relationship between gain change and the trigger is illustrated and the change is shown to occur while the field effect transistor is below −2 volts on gate #1 such that there is no spike or dip in the carrier.

FIG. 5 illustrates a sine wave signal 43. This Figure illustrates an important relationship between a gain change and the trigger. The rise time of the Q output 49 occurs in approximately 10 nanoseconds. The Q change takes place while the FET 30 is below the −2 volt level 43B on gate #1 so that there is no spike or dip in the carrier. The change is at the negative edge cross over point.

The point where the trigger takes effect is adjustable by a resistor in the circuit. The resistor can be used as a short delay adjustment for optimum results since the trigger bias could be changed so the action would take place anywhere between the lines marked by numerals 43A and 43C. This occurs at approximately 100 nanoseconds since this waveform is for 1 MHz. At higher frequency, no delay would be required.

The last major component of circuit is the gate 47. A NAND gate is preferably utilized. The data bus goes directly to the J input and the gate goes to the K so inputs are always opposite. A 7400 NAND gate was utilized in the exemplary embodiment of circuit.

On any Flip-Flop, there is a critical period where the Flip-Flop's output may be adversely affected if the J-K inputs are changed concurrently with the trigger. In order to prevent this, the carrier is counted down, using a counter that counts on the positive transition of the trigger. For example, if the data rate is 250 kHz, the counter would simply divide the carrier by four, and its output would move the shift register furnishing data. Thus, the data change from the shift register to the J and K inputs would always be at a safe timing point. The data would change on the positive position and the trigger would occur later.

It will be apparent to those skilled in the art that data may be fed to the circuit 10 in many different fashions, but in general, a shift register 16 bits long, parallel loaded in eight bit increments, is nominal. In such an embodiment, data could be shifted left to right and when the register had shifted eight times, a reload signal would cause the left eight registers to be loaded again. Data from the right most register would be applied to the modulator. This is just one simple approach to using the circuit, and many others are practical.

As previously mentioned, the circuit utilizes a negative edge triggered JK Flip-Flop 46. The carrier should have an amplitude of 3 to 6 volts RMS. Additionally, the carrier should be a multiple of the data rate. As may be seen from FIG. 3, four highs are followed by four lows. The operating carrier used was 1 MHz. To consistently have four cycles per data pulse, the data rate was 250,000 per second.

As will be apparent to a practitioner of the art, the exemplary embodiment of the invention provides at least the following improvements over the prior art:

1. Data sent from the modulator is synchronized to the carrier frequency;
2. The modulation level is changed only when the modulation FET is near or below the drain current cut off (this prevents spikes or dips in the output waveforms and limits the bandwidth required for operation);
3. There are neither tones nor frequency shifts required to convey intelligence, thus, only the carrier amplitude is utilized and detection is level (a preset counter would be used for divide by "N") and the only sidebands produced by this modulation process are those that correspond to the data rate (when the rate is kept high, e.g., 20 kHZ, a good RF band pass filter may be utilized to remove these sidebands);

4. Higher rates make higher frequency sidebands and the higher sidebands are easier to eliminate;

The negative edge triggered Flip-Flop selected was only one of several possible. The standard plug in type utilized in the exemplary embodiment was a dual unit with separate trigger inputs.

Only one of the Flip-Flops is used and the preset of the unused half, pin 10 labeled 2 PRE should be grounded. In any case there are other Flip-Flops which will operate up to 110 MHz.

The Flip-Flop chosen in the exemplary embodiment is actually best described as a sample and hold device. The Q output goes high when the J input is high on the next negative trigger input.

Additionally, there may be requirements by some users to use three or more output levels. Such users may be accommodated by using the SHM-4860, manufactured by DATEL. Several other models are also available from PMI, Hewlett Packard, and Tektronix. Such devices may also be utilized for plain data, as well as voice, facsimile data, and the like.

Selection of any of the components depends primarily on individual requirements and availability. For example, the Texas Instrument 54LS113A operates to a minimum of 25 MHz while their 74LS113A operate to a minimum of 30 MHz, however, the 74LS113A has a lower temperature deviation permissible. At the same time, the Fairchild Version 54E113 or 75F113 will operate at a minimum of 100 and 110 MHz respectively. These items will all plug in the same socket with no wiring changes, however, the Fairchild models operate on much lower signal levels at input, and the output is usually lower. The particular dual gate FET selected might also have been replaced by several from other manufacturers. The EC 454 will operate up to 900 MHz.

The present invention may be utilized in computer to computer transfer of DATA by local area network, radio transmission, remote equipment control, surface-to-air and air-to-surface military applications, and long range radio transmission. The present invention may be utilized with any carrier frequency from audio up to 40 megacycles. The present invention may also accept DATA signals to a very high percentage of the carrier frequency (up to 50 percent).

Due to the standardization of the DATA rates in use to multiples of 2, that is 512 kHZ, 1024 kHZ, 2048 kHZ, etc., the best carrier to use with this system to maintain absolute synchronization would be to use a carrier of the same multiples, at least two times higher than the highest DATA rate to be sent. IF the highest rate to be sent from some unit to another was 1024 kHZ, then the carrier should be two or more times that frequency.

In a normal DATA operation, the input voltage would probably be from a shift register that is parallel loaded and serial shifted into the inverter gate. The voltages, or rather data bits, to the shift register would most probably be output from a computer memory. If for example, the rate was 512 kHz and the carrier was at 2048 kHz, then the high would be four cycles long for each HIGH data bit. If there were several HIGH bits in succession the sample and hold portion of the circuit would retain the same output level throughout that period before changing. There would be no change in the modulator level until a LOW signal was processed.

The frequency can be up converted to any normal frequency the operator is authorized to use. If the same carrier just mentioned were used, the driver or carrier frequency used could be counted down by four, and that output would be used to drive the shift register to the next data bit.

A very common problem occurs in communication when two aircraft are flying in opposite directions or directly toward each other. This problem develops because synchronization problems occur due to the doppler effect. The present invention would provide different methods of developing phase locked loops to prevent this problem.

The present invention could be constructed using many types of electronic parts such as vacuum tubes, nuvistors, transistors, and FETS, integrated circuits, or modules could be constructed specifically for this purpose, using a 24 pin unit or the like. With few changes the invention could be utilized as an absorption type modulator if it was necessary to remove the RF carrier during the LOW DATA transmission.

Figure 6:
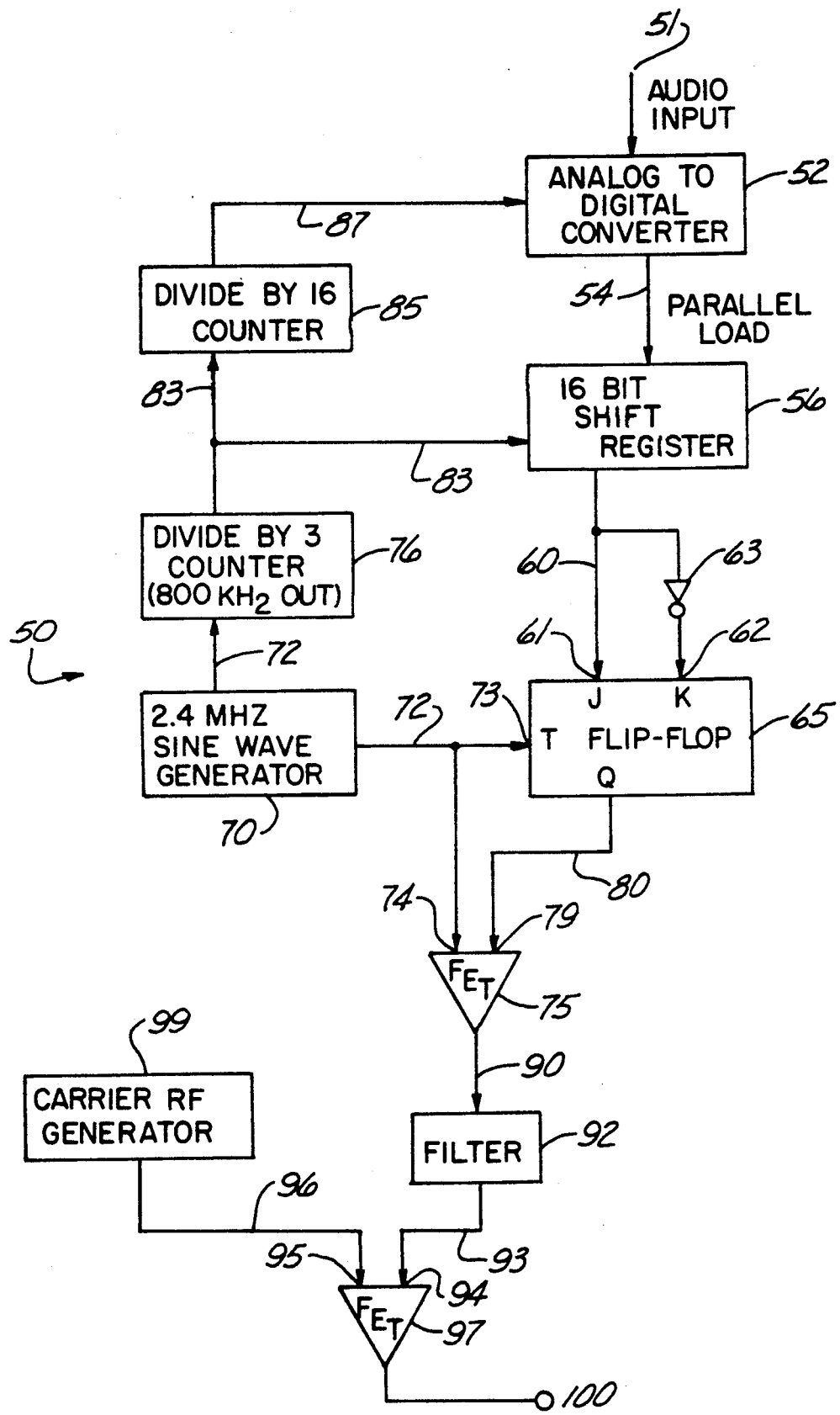
FIGS. 6 is a block diagram of another embodiment of the present invention showing the operation of the amplitude modulator with an audio input.

Referring now to FIG. 6, another embodiment of the present invention is shown. The modulator 50 receives an audio signal at input 51. Obviously, the modulator 50 could be designed to receive a wide variety of analog signals. The analog/audio signal enters an analog-to-digital converter 52 where it is converted to a 16 bit binary sample and loaded in parallel to a 16 bit shift register 56. The data is then processed in an identical fashion as discussed above when referring to FIGS. 1 and 2. The modulator 50 utilizes a 2.4 MHz sine wave generator 70 for the synchronizing signal. A divide by three counter is used to trigger the 16 bit shift register 56. The result is that one bit of data is transferred every three cycles which leads to a data transfer rate of 800,000 bits per second. The divide by sixteen counter 85 triggers the analog to digital converter to load another 16 bits into the shift register 56. The divide by sixteen counter 85 is triggered by the divide by three counter 75. This leads to a sample rate of 50,000 samples per second by the analog to digital converter 52.

Figure 7:
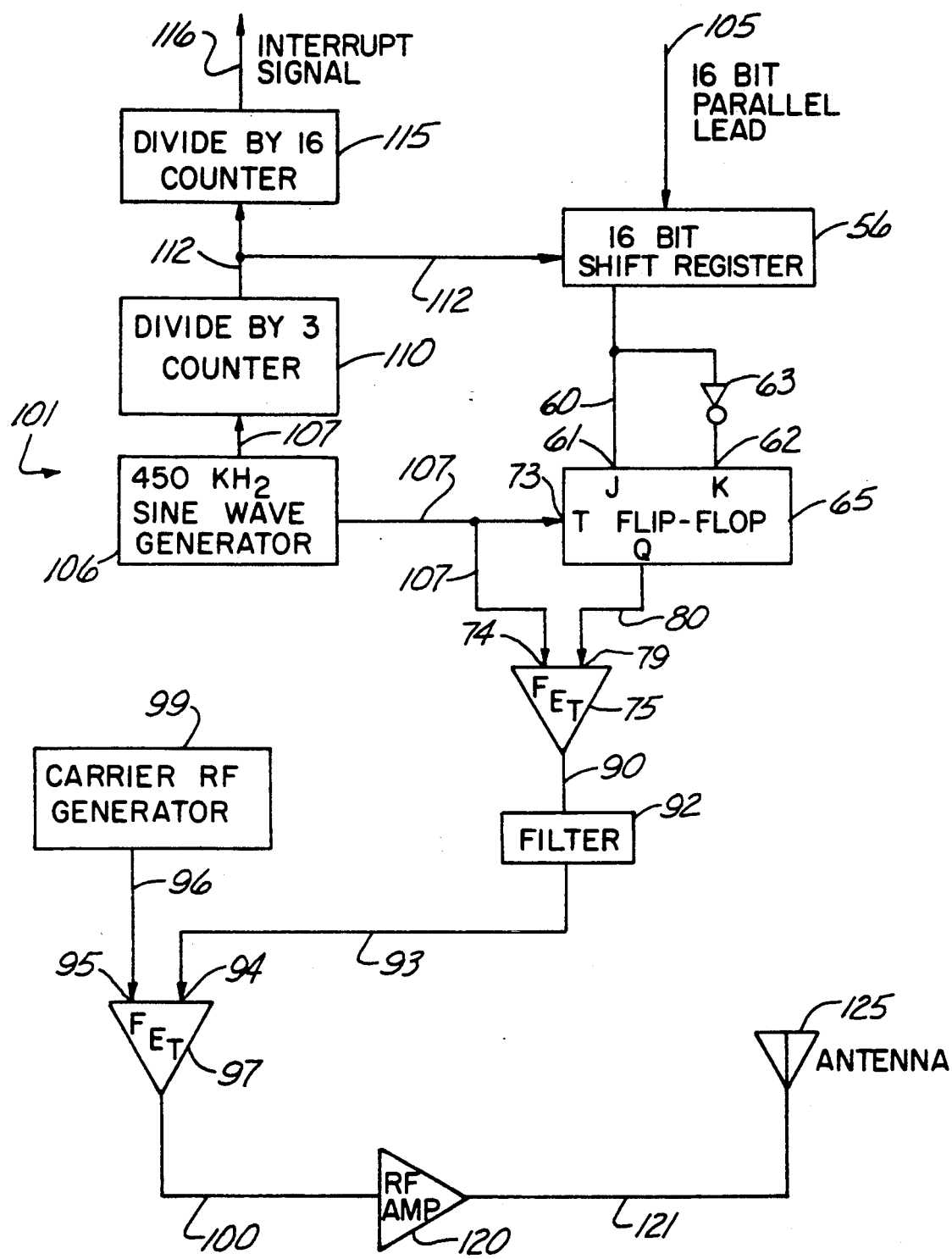
FIG. 7 is a block diagram of a still further embodiment of an amplitude modulator built in accordance with the present invention showing a parallel digital data load providing the input information and showing how the output signal could be amplified and transmitted over an antenna.

FIG. 7 shows yet another embodiment of the present invention. The modulator 101 of this embodiment is configured to receive a 16 bit parallel load from an outside data source. Examples of outside data sources include computers, CD-ROM's, modems, and a variety of other information storage devices. Additionally, the input source is not limited merely to storage type devices and various real time information sources could be an input source. The sixteen bit data is loaded into a shift register 56 in a similar manner as discussed previously. The modulator 101 uses a 450 KHz sine wave generator 106 to generate the synchronizing frequency. A divide by three counter 110 is triggered by the sine wave generator and triggers the shift register 56 and a divide by 16 counter 116 which signals when another load of data should be transferred to the shift register 56. The modulator thus is capable of transmitting one bit of data every three cycles which amounts to 150,000 bits per second.

The output 100 of the modulator 101 is connected to an RF amplifier 120. The amplified output is connected to an antenna 125 by line 121 The data can then be transmitted over the air waves via any radio frequency where it can be received and decoded at the receiving end.

Both modulators of FIGS. 6 and 7 utilized divide by three counters to trigger the shift registers and thus determine the number of cycles used per bit of data transferred. As a practical matter, it is often convenient to use divide by three counters because of the ease in which they can be reset. However, nothing would prevent the use of any other number of cycles per bit and it is anticipated that depending upon the use chosen other numbers will be preferred.

Figure 8:
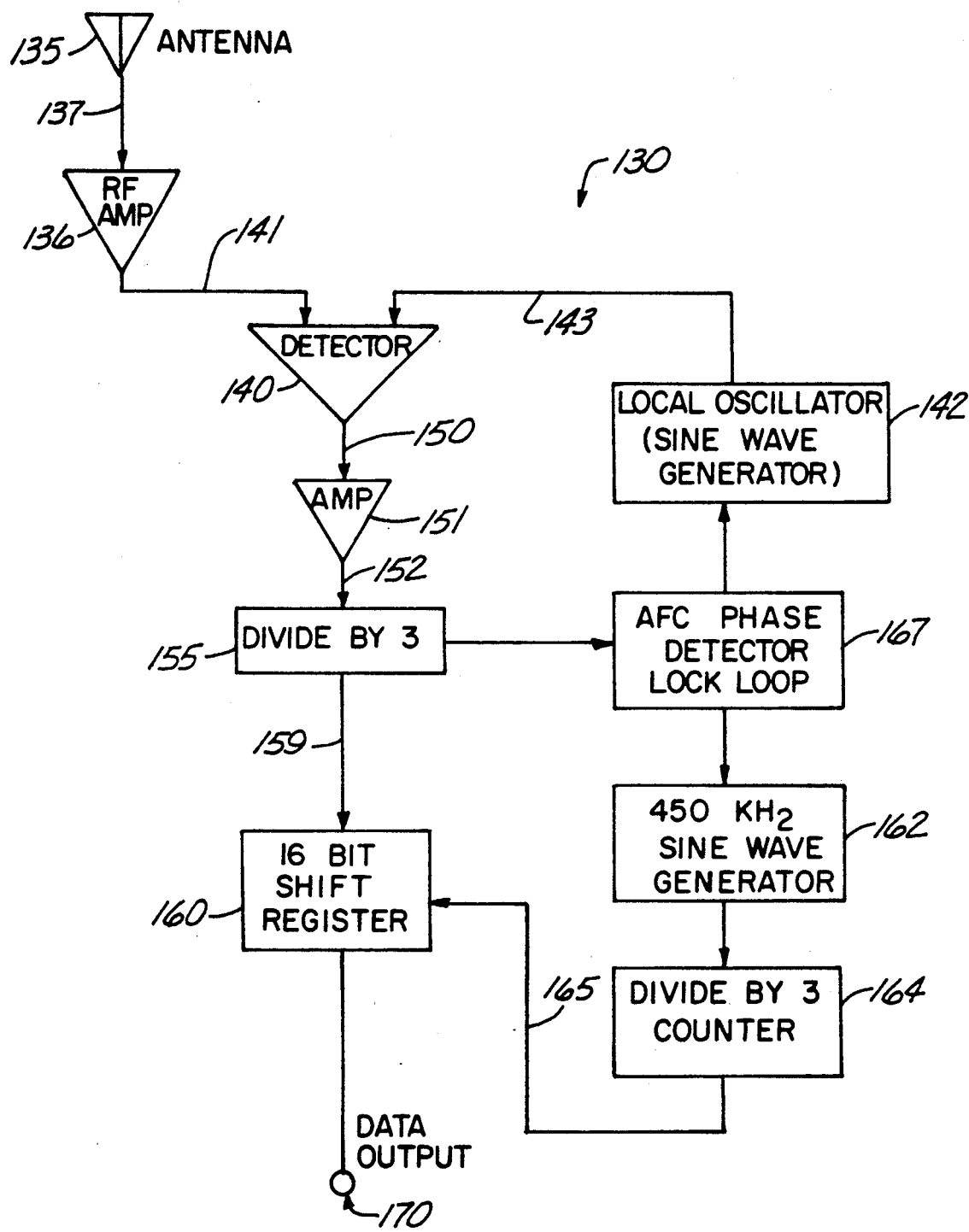
FIG. 8 is a block diagram of an apparatus which could be used to receive and decode the information of the amplitude modulator of FIG. 7.

Referring now to FIG. 8, a receiving device 130 is shown which is capable of receiving and decoding the signal of the amplitude modulator 101 of FIG. 7. The signal is received by the antenna 135 which is connected to an amplifier 136 by line 137. The amplified signal is sent to a detector or mixer 140 by line 141. Also input into the detector 140 is a sine wave generated by a local oscillator 142. This connection is made using line 143. The local oscillator 142 produces a sine wave corresponding in frequency to that of the RF generator 99 of FIG. 7. The detector 140 effectively removes the RF generated frequency from the signal leaving only the modulated 450 KHz signal. Detecting and decoding devices of this type are well known in the arts.

The signal from the detector 140 is sent through line 150 to an amplifier 151. The amplified signal is then sent from the amplifier 151 to a divide-by-three counter 155 through line 152. The divide-by-three counter is used to decode the digital data from the 450 KHz signal. The decoded data is then transferred to a 16 bit shift register 160 through line 159. The divide-by-three counter 155 is connected to phase detector lock loop 167 which is used to synchronize all of the incoming signals including a 450 KHz sine wave generator 162 which is fed into a divide-by-three counter 164. The output of the divide-by-three counter 164 is connected to the 16 bit shift register 160 through line 165 and is used to trigger the shift register 160 at the appropriate times. The digital data is thus available from the shift register 160 at output 170. The digital data at output 170 corresponds to the data input on the parallel load 105 of FIG. 7 after having potentially travelled a great distance. The digital data at output 170 could be sent to a digital-to-analog converter (not shown) if the input signal had been analog.

While the invention has been described with a certain degree of particularity, it is manifest that many changes may be made in the details of construction and the arrangement of components without departing from the spirit and scope of the disclosure. It is understood that the invention is not limited to the embodiments set forth herein for purposes of exemplification, but is to be limited only by the scope of the appended claims including the full range of equivalency to which each element thereof is entitled.

Thus, there has been shown and described a synchronous single cycle sample and control modulator which accomplishes at least all of the stated objects.

I claim:

1. A synchronous single cycle sample and control amplitude modulator comprising:
   data input means for receiving data;
   sine wave generator means for generating a sine wave at a specified frequency;
   sample and hold means for synchronizing said data from said data input means with said sine wave from said sine wave generator means;
   modulator means electrically connected to said sample and hold means and said sine wave generator means for modulating said sine wave from said sine wave generator wherein the amplitude of said sine wave is modulated with respect to the output of said sample and hold means;
   output means electrically connected to said modulator means for transmitting said modulated signal; and
   wherein said data input means includes a shift register means for serially supplying data to said sample and hold means when said data supplied to said data input means is supplied in parallel form.

2. A synchronous single cycle sample and control amplitude modulator comprising:
   data input means for receiving data;
   sine wave generator means for generating a sine wave at a specified frequency;
   sample and hold means for synchronizing said data from said data input means with said sine wave from said sine wave generator means;
   modulator means electrically connected to said sample and hold means and said sine wave generator means for modulating said sine wave from said sine wave generator wherein the amplitude of said sine wave is modulated with respect to the output of said sample and hold means;
   output means electrically connected to said modulator means for transmitting said modulated signal;
   dividing means for dividing said sine wave by a constant factor; and
   triggering means for triggering said sample and hold means with the output of said dividing means whereby the output of said sample and hold means will be held and thus modulate said sine wave for the same number of cycles of said sine wave as said constant factor.

3. A synchronous single cycle sample and control amplitude modulator comprising:
   data input means for receiving data;
   sine wave generator means for generating a sine wave at a specified frequency;
   sample and hold means for synchronizing said data from said data input means with said sine wave from said sine wave generator means;
   modulator means electrically connected to said sample and hold means and said sine wave generator means for modulating said sine wave from said sine wave generator wherein the amplitude of said sine wave is modulated with respect to the output of said sample and hold means;
   output means electrically connected to said modulator means for transmitting said modulated signal;
   band pass filter means electrically connected to said output mans for removing the side bands of said modulated signal;
   generating means for generating a radio frequency (RF) carrier wave;
   mixing means electrically connected to said generating means and said filter means for combining said modulated signal and said RF carrier wave; and
   means for transmitting the combined signal from said mixing means.

4. The apparatus of claim 3 wherein the mixing means comprises essentially a field effect transistor (FET).

5. The apparatus of claim 3 wherein said means for transmitting the combined signal includes:
   means for amplifying said combined signal;
   an antenna; and
   means for electrically connecting said means for amplifying said combined signal and said antenna.

6. The apparatus of claim 1 wherein said sample and hold means comprises essentially of a Flip-Flop.

7. The apparatus of claim 6 wherein said Flip-Flop comprises a negative edge triggered JK Flip-Flop.

8. The apparatus of claim 1 wherein said modulator means comprises essentially a field effect transistor (FET).

9. The apparatus of claim 2 wherein said sample and hold means comprises essentially a Flip-Flop.

10. The apparatus of claim 9 wherein said Flip-Flop comprises a negative edge triggered JK Flip-Flop.

11. The apparatus of claim 2 wherein said modulator means comprises essentially a field effect transistor (FET).

12. The apparatus of claim 3 wherein said sample and hold means comprises essentially a Flip-Flop.

13. The apparatus of claim 12 wherein said Flip-Flop comprises a negative edge triggered JK Flip-Flop.

14. The apparatus of claim 3 wherein said modulator means comprises essentially a field effect transistor (FET).

* * * * *